(12) United States Patent
Wang et al.

(10) Patent No.: US 8,536,947 B2
(45) Date of Patent: Sep. 17, 2013

(54) CLASS AB AMPLIFIER WITH RESISTIVE LEVEL-SHIFTING CIRCUITRY

(75) Inventors: Cheng-Han Wang, San Jose, CA (US); Tzu-wang Pan, Saratoga, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/340,142

(22) Filed: Dec. 19, 2008

(65) Prior Publication Data
US 2010/0156532 A1    Jun. 24, 2010

(51) Int. Cl.
    *H03F 3/45* (2006.01)
(52) U.S. Cl.
    USPC ............................. 330/255; 330/261; 330/267
(58) Field of Classification Search
    USPC .................. 330/253, 255; 327/333
    See application file for complete search history.

(56) References Cited

U.S. PATENT DOCUMENTS

| | | | |
|---|---|---|---|
| 3,629,717 A | 12/1971 | Bisgaard | |
| 4,021,746 A | 5/1977 | Suzuki | |
| 4,056,783 A | 11/1977 | Harrison | |
| 4,912,425 A * | 3/1990 | Kobayashi et al. | 330/253 |
| 5,442,319 A * | 8/1995 | Seesink et al. | 330/261 |
| 5,467,058 A | 11/1995 | Fujita | |
| 5,886,577 A | 3/1999 | Keating | |
| 5,973,563 A | 10/1999 | Seven | |
| 6,028,479 A * | 2/2000 | Babanezhad | 330/253 |
| 6,268,941 B1 | 7/2001 | Halldorsson | |
| 6,750,715 B2 * | 6/2004 | Allott et al. | 330/258 |
| 7,088,182 B2 | 8/2006 | Ivanov | |
| 7,301,399 B2 | 11/2007 | Yoshida et al. | |
| 2005/0030097 A1 | 2/2005 | Ivanov et al. | |

(Continued)

FOREIGN PATENT DOCUMENTS

| | | |
|---|---|---|
| GB | 1395337 | 5/1975 |
| GB | 2275382 | 8/1994 |

(Continued)

OTHER PUBLICATIONS

International Search Report and Written Opinion—PCT/US2009/068942, International Search Authority—European Patent Office—Jun. 10, 2010.
Partial International Search Report—PCT/US2009/068942, International Search Authority—European Patent Office—Apr. 16, 2010.
Quiquempoix, V, et al., "A low-power 22-bit incremental ADC", Solid-State Circuits, IEEE Journal of, vol. 41, Issue: 7, Digital Object Identifier: 10.1109/JSSC.2006.873891, Publication Year: 2006, pp. 1562-1571.

*Primary Examiner* — Robert Pascal
*Assistant Examiner* — Khiem Nguyen
(74) *Attorney, Agent, or Firm* — Ramin Mobarhan

(57) ABSTRACT

A class AB amplifier with resistive level-shifting circuitry is described. In one exemplary design, the class AB amplifier includes an input stage, a resistive level-shifting stage, a class AB output stage, and a bias circuit. The input stage receives an input signal and provides a first drive signal. The resistive level-shifting stage receives the first drive signal and provides a second drive signal. The output stage receives the first and second drive signals and provides an output signal. The bias circuit generates a bias voltage for the resistive level-shifting stage to obtain a desired quiescent current for the output stage. In one exemplary design, the resistive level-shifting stage includes a transistor and a resistor. The transistor receives the bias voltage and provides the second drive signal. The resistor is coupled to the transistor and provides a voltage drop between the first and second drive signals.

27 Claims, 10 Drawing Sheets

(56) References Cited

U.S. PATENT DOCUMENTS

| | | |
|---|---|---|
| 2005/0179495 A1 | 8/2005 | Sung |
| 2006/0208800 A1 | 9/2006 | Harman |
| 2008/0122537 A1 | 5/2008 | Miyata |
| 2008/0252372 A1 * | 10/2008 | Williams .................. 330/251 |

FOREIGN PATENT DOCUMENTS

| | | |
|---|---|---|
| JP | 5167363 A | 7/1993 |
| JP | 2005323287 A | 11/2005 |
| JP | 2008219307 A | 9/2008 |
| WO | WO9318582 | 9/1993 |
| WO | WO0137422 | 5/2001 |

\* cited by examiner

CLASS AB AMPLIFIER WITH RESISTIVE LEVEL-SHIFTING CIRCUITRY

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs). Amplifiers may also be used for active filters and other circuit blocks within the transmitter and receiver.

Various classes of amplifiers may be used for signal amplification. A class A amplifier operates in a linear region all the time and may have better linearity at the expense of greater power consumption. A class B amplifier typically employs two complementary output transistors, with each output transistor being turned on for half of the time and turned off for the other half of the time. A class B amplifier has lower power consumption than a class A amplifier but may be susceptible to crossover distortion due to the turn-on of one output transistor not matching the turn-off of the other output transistor. A class AB amplifier also employs two complementary output transistors (similar to a class B amplifier), albeit with each output transistor being turned on for more than half of the time in order to reduce crossover distortion. A class AB amplifier may provide good compromise between linearity and power consumption.

DETAILED DESCRIPTION

The word "exemplary" is used herein to mean "serving as an example, instance, or illustration." Any design described herein as "exemplary" is not necessarily to be construed as preferred or advantageous over other designs.

A class AB amplifier with resistive level-shifting circuitry is described herein. The class AB amplifier may be used for various electronics devices such as wireless communication devices, cellular phones, personal digital assistants (PDAs), handheld devices, wireless modems, laptop computers, cordless phones, Bluetooth devices, broadcast receivers, etc. For clarity, the use of the class AB amplifier for a wireless communication device is described below.

Figure 1:
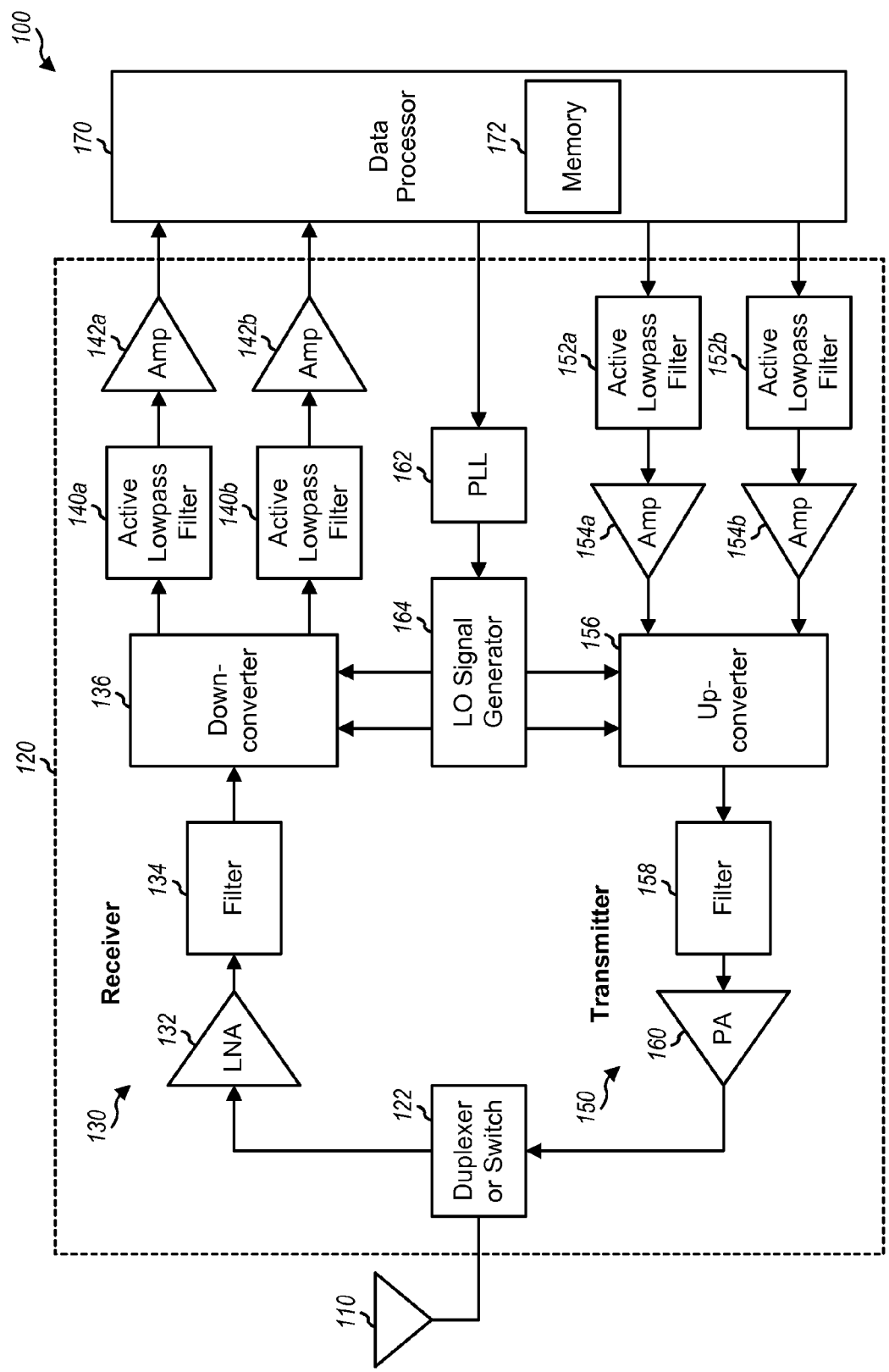
FIG. 1 shows a block diagram of a wireless communication device.

FIG. 1 shows a block diagram of a wireless communication device 100, which may be a cellular phone or some other device. In the exemplary design shown in FIG. 1, wireless device 100 includes a transceiver 120 and a data processor 170 having a memory 172 to store data and program codes. Transceiver 120 includes a receiver 130 and a transmitter 150 that support bi-directional communication. In general, wireless device 100 may include any number of receivers and any number of transmitters for any number of communication systems and frequency bands.

A receiver or a transmitter may be implemented with a super-heterodyne architecture or a direct-conversion architecture. In the super-heterodyne architecture, a signal is frequency converted between radio frequency (RF) and baseband in multiple stages, e.g., from radio frequency (RF) to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the exemplary design shown in FIG. 1, receiver 130 and transmitter 150 are implemented with the direct-conversion architecture.

In the receive path, an antenna 110 receives signals transmitted by base stations and/or other transmitter stations and provides a received RF signal, which is routed through a duplexer or switch 122 and provided to receiver 130. Within receiver 130, the received RF signal is amplified by a low noise amplifier (LNA) 132 and filtered by a filter 134 to obtain an RF input signal. A downconverter 136 downconverts the RF input signal with inphase and quadrature receive local oscillator signals (I and Q RX LO signals) from an LO signal generator 164 and provides I and Q downconverted signals. Active lowpass filters 140a and 140b filter the I and Q downconverted signals, respectively, to remove images and out-of-band noise and provide I and Q filtered signals. Amplifiers (Amp) 142a and 142b amplify the I and Q filtered signals, respectively, to obtain the desired signal amplitude and provide I and Q input baseband signals to data processor 170.

In the transmit path, data processor 170 processes data to be transmitted and provides I and Q output baseband signals to transmitter 150. Within transmitter 150, active lowpass filters 152a and 152b filter the I and Q output baseband signals, respectively, to remove images caused by the prior digital-to-analog conversion. Amplifiers 154a and 154b amplify the signals from active lowpass filters 152a and 152b, respectively, and provide I and Q amplified signals. An upconverter 156 upconverts the I and Q amplified signals with I and Q transmit (TX) LO signals from LO signal generator 164 and provides an upconverted signal. A filter 158 filters the upconverted signal to remove images caused by the frequency upconversion as well as noise in a receive frequency band. A power amplifier (PA) 160 amplifies the signal from filter 158 to obtain the desired output power level and provides a transmit RF signal. The transmit RF signal is routed through duplexer or switch 122 and transmitted via antenna 110.

LO signal generator 164 generates the I and Q RX LO signals used for frequency downconversion as well as the I and Q TX LO signals used for frequency upconversion. A phase locked loop (PLL) 162 receives timing information from data processor 170 and generates control signals used to adjust the frequency and/or phase of the TX LO signals and the RX LO signals from LO signal generator 164.

FIG. 1 shows an exemplary design of a transceiver. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

As shown in FIG. 1, a transmitter and a receiver may include various amplifiers. Furthermore, active lowpass filters 140a, 140b, 152a and 152b may also include amplifiers. Each amplifier may be implemented with various designs.

Figure 2:
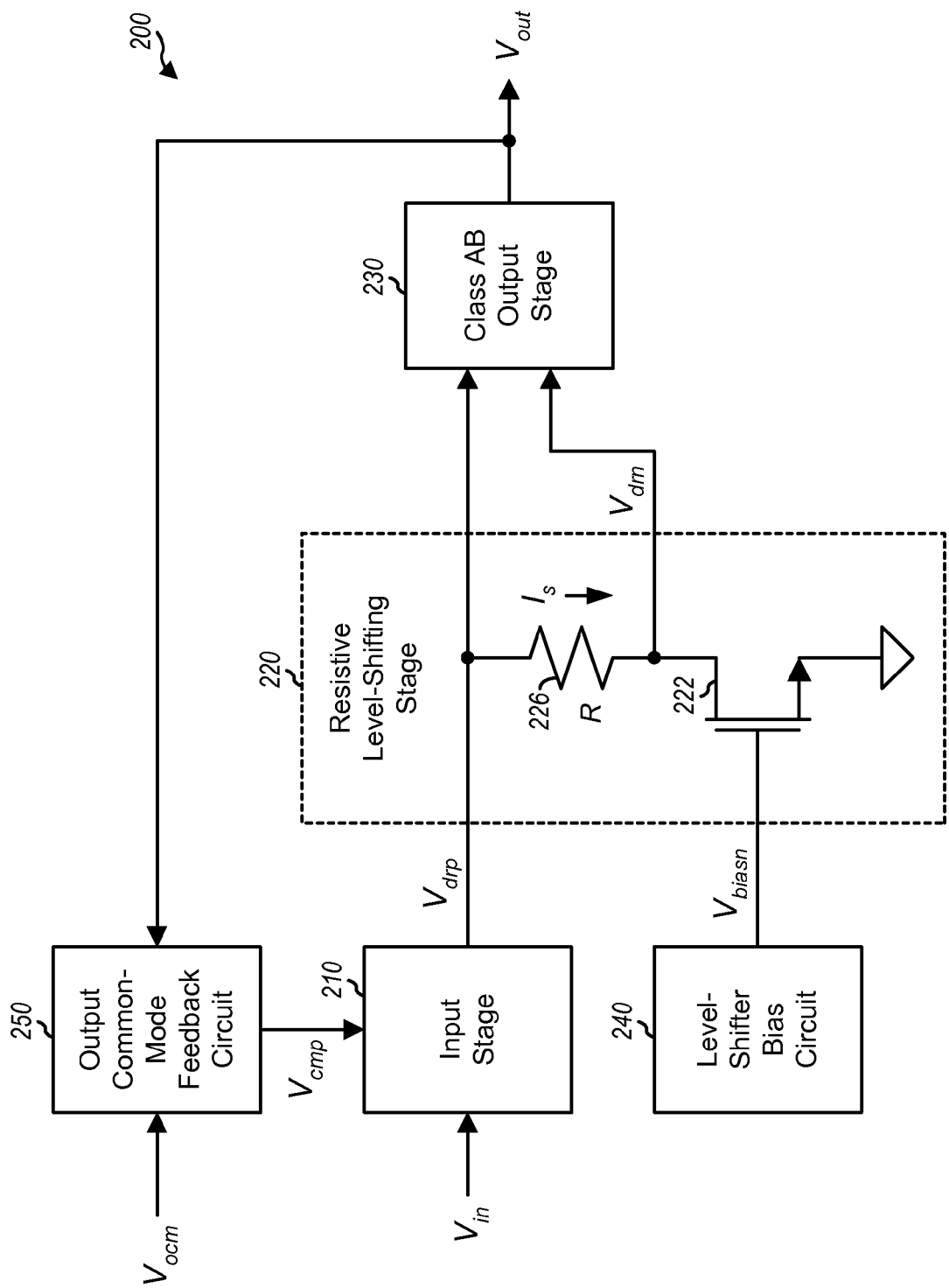
FIG. 2 shows a class AB amplifier with resistive level-shifting circuitry.

FIG. 2 shows a block diagram of an exemplary design of a class AB amplifier 200 with resistive level-shifting circuitry. Amplifier 200 may be used for any of the amplifiers and circuit blocks shown in FIG. 1. In the exemplary design shown in FIG. 2, class AB amplifier 200 includes an input stage 210, a resistive level-shifting stage 220, a class AB output stage 230, a level-shifter bias circuit 240, and an output common mode (OCM) feedback circuit 250.

Input stage 210 receives and amplifies an input signal, $V_{in}$, and provides a first drive signal, $V_{drp}$, which is P-channel signaling. Input stage 210 may be implemented with a common-source amplifier stage, a common-gate amplifier stage, a class AB amplifier stage, etc. Resistive level-shifting stage 220 receives the $V_{drp}$ signal and generates a second drive signal, $V_{drn}$, which is N-channel signaling. Within stage 220, an N-channel metal oxide semiconductor (NMOS) transistor 222 has its source coupled to circuit ground and its gate receiving a bias voltage, $V_{biasn}$. The terms "transistor" and "device" are often used interchangeably. A resistor 226 with a resistance value of R has one end coupled to the drain of NMOS transistor 222 and the other end receiving the $V_{drp}$ signal.

Level-shifter bias circuit 240 generates the $V_{biasn}$ voltage to obtain the desired voltage drop across resistor 226, so that the $V_{drn}$ signal is level-shifted or offset from the $V_{drp}$ signal by the desired amount. In particular, the $V_{biasn}$ voltage applied at the gate of NMOS transistor 222 results in a level-shifting current of $I_s$ flowing across resistor 226. The $V_{drn}$ signal is level-shifted by the voltage drop across resistor 226 and may be expressed as:

$$V_{drn} = V_{drp} - I_s \cdot R \quad \text{Eq (1)}$$

The $V_{drn}$ signal may be generated to obtain a target quiescent current for class AB output stage 230, as described below.

Class AB output stage 230 receives the $V_{drp}$ and $V_{drn}$ signals and provides an output signal, $V_{out}$. Output stage 230 may include one or more pairs of complementary output transistors. The $V_{drp}$ and $V_{drn}$ signals are input signals for the complementary output transistors, as described below.

Output common mode feedback circuit 250 receives a target output common mode voltage, $V_{ocm}$, and the $V_{out}$ signal from output stage 230 and generates a common mode control voltage, $V_{cmp}$, for input stage 210. Circuit 250 operates within a feedback loop that also includes input stage 210 and output stage 230. The feedback loop adjusts the $V_{cmp}$ voltage for input stage 210 to obtain the target average voltage for the $V_{out}$ signal.

FIG. 2 shows a simplified block diagram of class AB amplifier 200. In general, input stage 210, resistive level-shifting stage 220, output stage 230, level-shifter bias circuit 240, and output common mode feedback circuit 250 may be implemented with various single-ended and differential designs. Furthermore, these stages and circuits may be implemented with various types of transistors. An exemplary design of class AB amplifier 200 with complementary metal oxide semiconductor (CMOS) transistors is described below.

Figure 3A:
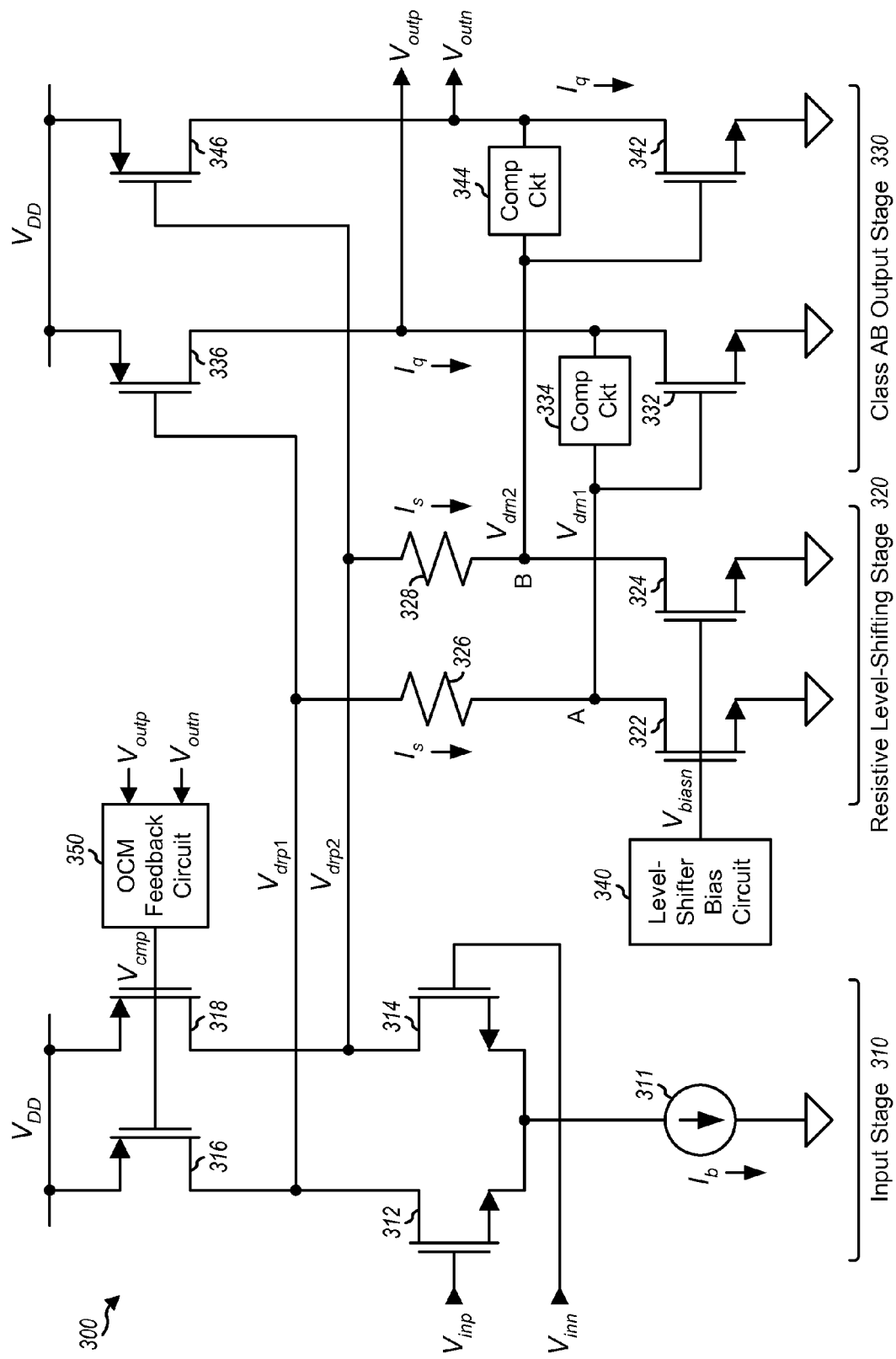
FIGS. 3A and 3B show two exemplary designs of a differential class AB amplifier with resistive level-shifting circuitry.

FIG. 3A shows a schematic diagram of an exemplary design of a differential class AB amplifier 300 with resistive level-shifting circuitry. Class AB amplifier 300 includes an input stage 310, a resistive level-shifting stage 320, a class AB output stage 330, a level-shifter bias circuit 340, and an output common mode feedback circuit 350. Blocks 310 through 350 in FIG. 3A may correspond to blocks 210 through 250, respectively, in FIG. 2. Input stage 310 receives a differential input signal composed of $V_{inp}$ and $V_{inn}$ signals. Output stage 330 provides a differential output signal composed of $V_{outp}$ and $V_{outn}$ signals.

Within input stage 310, NMOS transistors 312 and 314 are coupled as a differential pair and have their sources coupled together and their gates receiving the $V_{inp}$ and $V_{inn}$ signals, respectively. A current source 311 is coupled between the sources of NMOS transistors 312 and 314 and circuit ground and provides a bias current of $I_b$. P-channel MOS (PMOS) transistors 316 and 318 have their sources coupled to a power supply voltage, $V_{DD}$, their gates receiving the $V_{cmp}$ voltage from feedback circuit 350, and their drains coupled to the drains of NMOS transistors 312 and 314, respectively. The drains of PMOS transistors 316 and 318 provide $V_{drp1}$ and $V_{drp2}$ drive signals, respectively.

Within resistive level-shifting stage 320, NMOS transistors 322 and 324 have their sources coupled to circuit ground, their gates receiving the $V_{biasn}$ voltage from bias circuit 340, and their drains coupled to nodes A and B, respectively. A resistor 326 has one end coupled to node A and the other end receiving the $V_{drp1}$ signal. A resistor 328 has one end coupled to node B and the other end receiving the $V_{drp2}$ signal. The drains of NMOS transistors 322 and 324 provide $V_{drn1}$ and $V_{drn2}$ drive signals, respectively.

Within output stage 330, NMOS transistors 332 and 342 have their sources coupled to circuit ground and their gates receiving the $V_{drn1}$ and $V_{drn2}$ signals, respectively. A compensation circuit (Comp Ckt) 334 is coupled between the drain and gate of NMOS transistor 332. A compensation circuit 344 is coupled between the drain and gate of NMOS transistor 342. Each compensation circuit may be implemented with a resistor coupled in series with a capacitor. PMOS transistors 336 and 346 have their sources coupled to the $V_{DD}$ supply voltage, their gates receiving the $V_{drp1}$ and $V_{drp2}$ signals, respectively, and their drains coupled to the drains of NMOS transistors 332 and 342, respectively. The drains of PMOS transistors 336 and 346 provide the $V_{outp}$ and $V_{outn}$ signals, respectively.

Class AB amplifier 300 operates as follows. NMOS transistors 312 and 314 amplify the $V_{inp}$ and $V_{inn}$ signals and provide the $V_{drp1}$ and $V_{drp2}$ drive signals for PMOS transistors 336 and 346 in output stage 330. PMOS transistors 316 and 318 provide an active load for NMOS transistors 312 and 314 and also provide signal drive for the $V_{drp1}$ and $V_{drp2}$ signals. Resistive level-shifting stage 320 receives the $V_{drp1}$ and $V_{drp2}$ drive signals and generates the $V_{drn1}$ and $V_{drn2}$ drive signals for NMOS transistors 332 and 342 in output stage 330. The $V_{drp1}$ and $V_{drn1}$ signals drive the first pair of complementary MOS transistors 332 and 336 in a first class AB output branch, which provides the $V_{outp}$ signal. The $V_{drp2}$ and $V_{drn2}$ signals drive the second pair of complementary MOS transistors 342 and 346 in a second class AB output branch, which provides the $V_{outn}$ signal.

Level-shifter bias circuit 340 generates the $V_{biasn}$ voltage for NMOS transistors 322 and 324 to obtain the desired voltage drop across resistors 326 and 328. The $V_{drn1}$ and $V_{drn2}$ signals are level-shifted from the $V_{drp1}$ and $V_{drp2}$ signals, respectively, by the desired amount. The $V_{drn1}$ and $V_{drn2}$ signals set the gate bias voltage for NMOS transistors 332 and 342, respectively, to obtain a target quiescent current of $I_q$ for each of the two class AB output branches.

Output common mode feedback circuit 350 receives the $V_{outp}$ and $V_{outn}$ signals from output stage 330 and generates the $V_{cmp}$ bias voltage for PMOS transistors 316 and 318 to obtain a target output common mode voltage of $V_{ocm}$, which is the desired average voltage of the $V_{outp}$ and $V_{outn}$ signals.

Figure 3B:
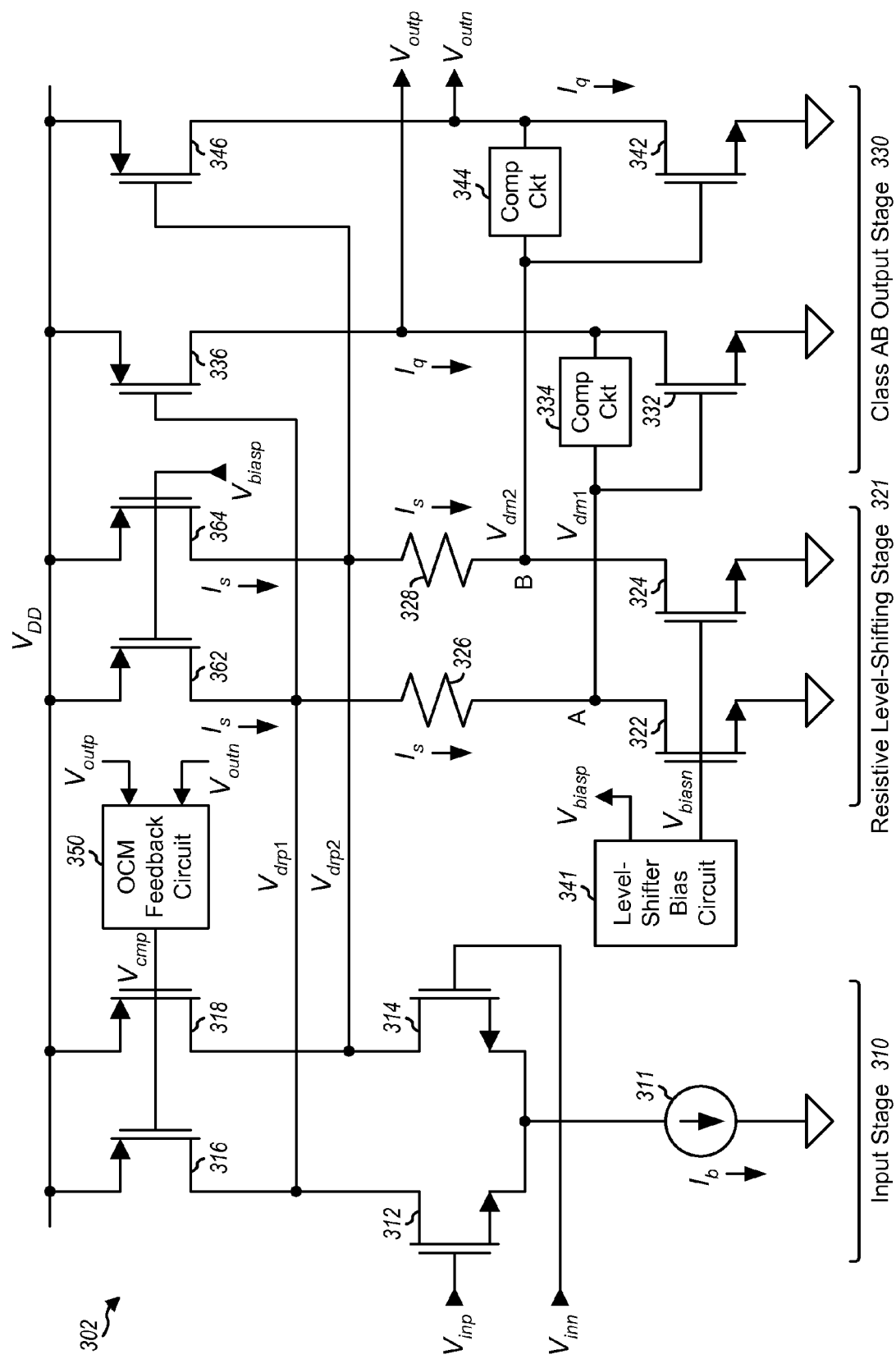

FIG. 3B shows a schematic diagram of an exemplary design of a differential class AB amplifier 302 with resistive level-shifting circuitry. Class AB amplifier 302 includes all of the stages and circuits in class AB amplifier 300 in FIG. 3A except for resistive level-shifting stage 320 and level-shifter bias circuit 340, which are replaced with a resistive level-shifting stage 321 and a level-shifter bias circuit 341, respectively. Stage 321 includes NMOS transistors 322 and 324 and resistors 326 and 328, which are coupled as described above for FIG. 3A. Stage 321 further includes PMOS transistors 362 and 364 having their sources coupled to the $V_{DD}$ supply voltage, their gates coupled together and receiving a $V_{biasp}$ bias voltage from bias circuit 341, and their drains coupled to resistors 326 and 328, respectively. PMOS transistor 362 provides a level-shifting current of $I_s$ for resistor 326. Similarly, PMOS transistor 364 provides a level-shifting current of $I_s$ for resistor 328. This avoids PMOS transistors 316 and 318 providing the $I_s$ level-shifting current for resistors 326 and 328, respectively, which may improve performance. The $V_{biasp}$ voltage may be generated by level-shifter bias circuit 341, as described below.

Figure 6:
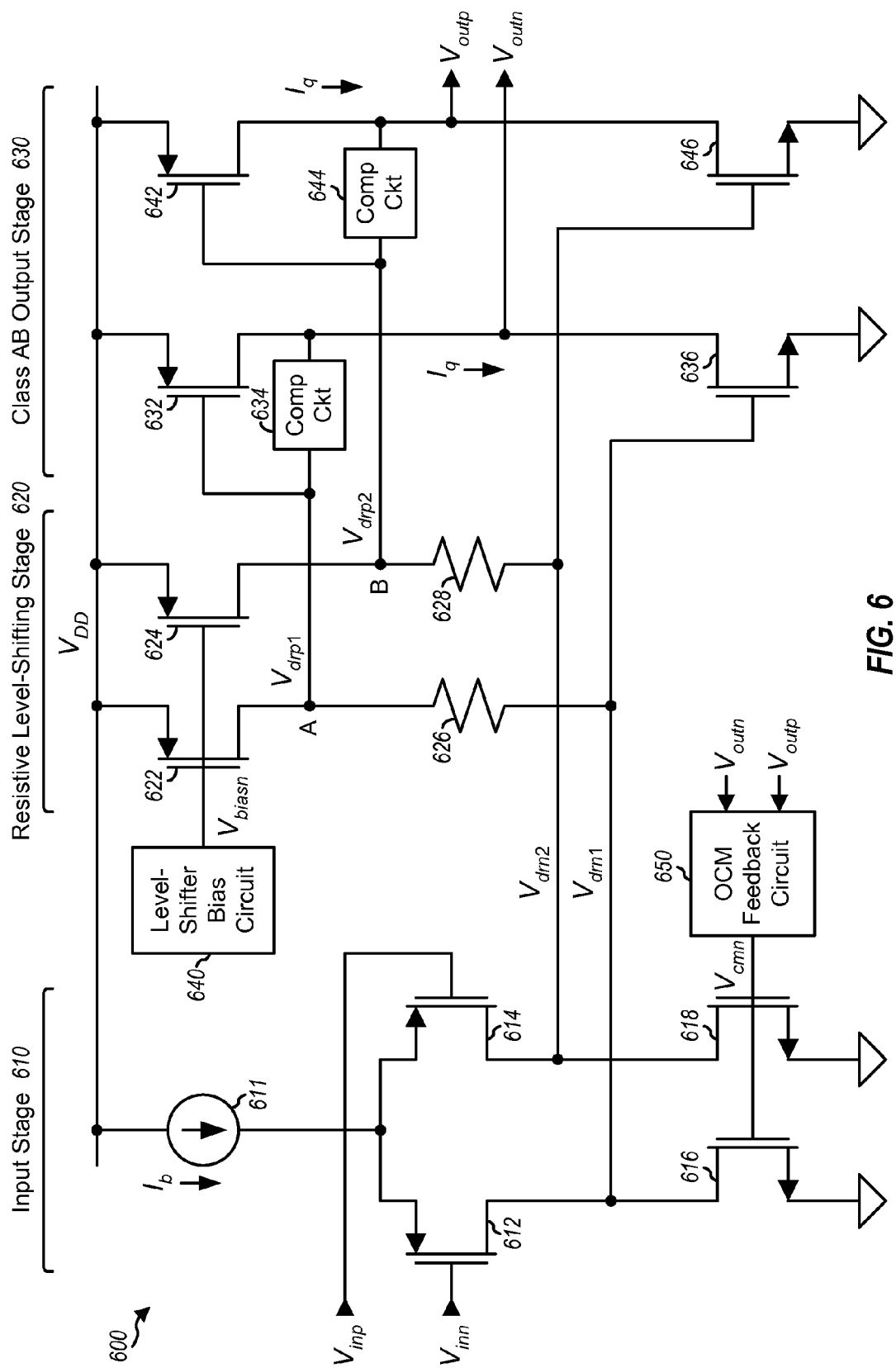
FIG. 6 shows another exemplary design of the differential class AB amplifier with resistive level-shifting circuitry.

FIGS. 3A and 3B show two exemplary designs of a differential class AB amplifier, which may also be implemented with other exemplary designs. Input stage 310 may be implemented with a cascode amplifier as shown in FIGS. 3A and 3B. Input stage 310 may also be implemented with a complementary cascode amplifier composed of PMOS transistors for the differential pair and NMOS transistors for the load, e.g., as shown in FIG. 6. Resistive level-shifting stages 320 and 321, class AB output stage 330, level-shifter bias circuits 340 and 341, and output common mode feedback circuit 350 may also be implemented in other manners.

Figure 4A:
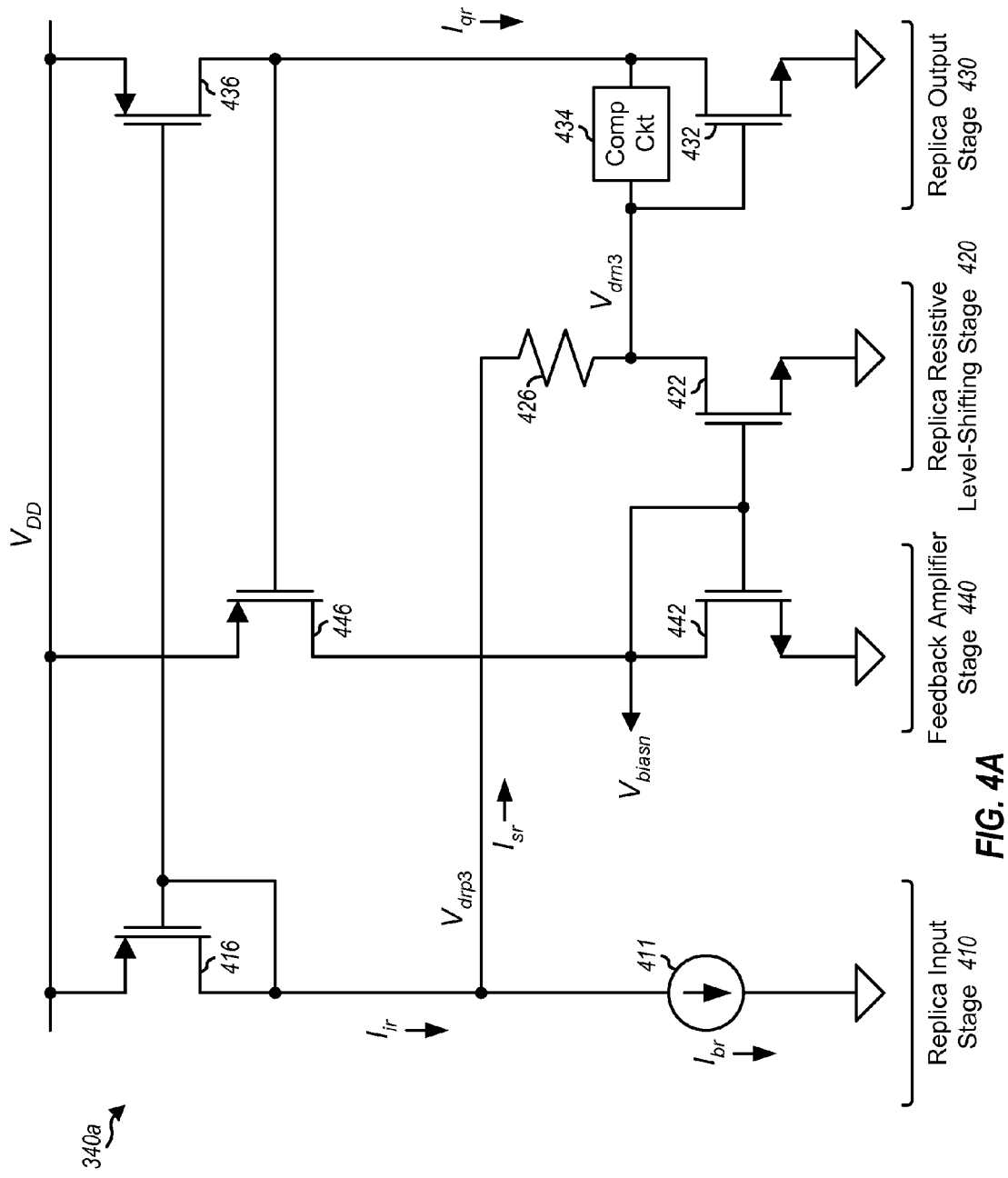
FIGS. 4A and 4B show two exemplary designs of a level-shifter bias circuit.

FIG. 4A shows a schematic diagram of an exemplary design of a level-shifter bias circuit 340a, which may be used for level-shifter bias circuit 340 in FIG. 3A. In this exemplary design, level-shifter bias circuit 340a includes a replica input stage 410, a replica resistive level-shifting stage 420, a replica output stage 430, and a feedback amplifier stage 440.

Replica input stage 410 includes a current source 411 and a PMOS transistor 416, which are replicas of current source 311 and PMOS transistor 316, respectively, in input stage 310 in FIG. 3A. PMOS transistor 416 is connected as a diode and has its source coupled to the $V_{DD}$ supply voltage, its gate coupled to its drain, and its drain providing a $V_{drp3}$ drive voltage. Current source 411 has one end coupled to the drain of PMOS transistor 416 and the other end coupled to circuit ground.

Replica resistive level-shifting stage 420 includes an NMOS transistor 422 and a resistor 426, which are replicas of NMOS transistor 322 and resistor 326, respectively, in resistive level-shifting stage 320 in FIG. 3A. NMOS transistor 422 has its source coupled to circuit ground, its gate receiving the $V_{biasn}$ voltage, and its drain providing a $V_{drn3}$ drive voltage.

Resistor 426 has one end coupled to the drain of NMOS transistor 416 and the other end coupled to the drain of NMOS transistor 422.

Replica output stage 430 includes an NMOS transistor 432, a compensation circuit 434, and a PMOS transistor 436, which are replicas of NMOS transistor 332, compensation circuit 334, and PMOS transistor 336, respectively, in output stage 330 in FIG. 3A. NMOS transistor 432 has its source coupled to circuit ground and its gate coupled to the drain of NMOS transistor 422. Compensation circuit 434 is coupled between the gate and drain of NMOS transistor 432. PMOS transistor 436 has its source coupled to the $V_{DD}$ supply voltage, its gate coupled to the gate of PMOS transistor 416, and is drain coupled to the drain of NMOS transistor 432.

Feedback amplifier stage 440 includes an NMOS transistor 442 and a PMOS transistor 446. NMOS transistor 442 has its source coupled to circuit ground and its gate coupled to its drain and further to the gate of NMOS transistor 422. PMOS transistor 446 has its source coupled to the $V_{DD}$ supply voltage, its gate coupled to the drain of PMOS transistor 436, and is drain coupled to the drain of NMOS transistor 442. The drains of MOS transistors 442 and 446 provide the $V_{biasn}$ voltage.

In one exemplary design, the MOS transistors in level-shifter bias circuit 340a in FIG. 4A have the same sizes (and hence the same current) as the corresponding MOS transistors in class AB amplifier 300 in FIG. 3A. In another exemplary design, the MOS transistors in level-shifter bias circuit 340a may have smaller (or larger) sizes than those of the corresponding MOS transistors in class AB amplifier 300. For example, each MOS transistor in FIG. 4A may have 1/M-th the size of the corresponding MOS transistor in FIG. 3A in order to scale down current by a factor of M. Smaller transistor sizes may result in less current flowing through the MOS transistors in level-shifter bias circuit 340a, which may reduce power consumption of bias circuit 340a. If the current through NMOS transistor 422 is scaled down by a factor of M, then resistor 426 may be scaled up by a factor or M in comparison to resistors 326 and 328 in FIG. 3A in order to obtain the same voltage drop across these resistors.

Level-shifter bias circuit 340a operates as follows. PMOS transistors 416 and 436 are coupled as a current mirror and their drain currents may be expressed as:

$$I_{qr} = K \cdot I_{ir}, \qquad \text{Eq (2)}$$

where $I_{ir}$ is the drain current of PMOS transistor 416,
$I_{qr}$ is the drain current of PMOS transistor 436, and
K is a ratio of the size of PMOS transistor 436 to the size of PMOS transistor 416.

$I_{qr}$ is the quiescent current of the class AB output stage composed of MOS transistors 432 and 436. The drain current of PMOS transistor 416 may be expressed as:

$$I_{ir} = I_{br} + I_{sr}, \qquad \text{Eq (3)}$$

where $I_{br}$ is the current through current source 411, and
$I_{sr}$ is the current through resistor 426.

A negative feedback loop is used to generate the $V_{biasn}$ voltage for NMOS transistor 422. The negative feedback loop starts at the $V_{biasn}$ voltage, then through NMOS transistor 422 as a first common source amplifier stage with negative gain, then through NMOS transistor 432 as a second common source amplifier stage with negative gain, then through PMOS transistor 446 as a third common source amplifier stage with negative gain, and then ending with NMOS transistor 442 as a unity-gain buffer stage. The negative feedback loop thus includes three negative gain stages, and compensation circuit 434 is used to ensure stability of the feedback loop.

The desired quiescent current $I_{qr}$ may be obtained by (i) selecting suitable values of $I_{br}$ and $I_{sr}$ and (ii) selecting the proper transistor size ratio K, as shown in equations (1) and (2). The negative feedback loop generates the $V_{biasn}$ voltage such that NMOS transistor 422 can provide the $V_{drn3}$ voltage such that NMOS transistor 432 will draw the quiescent current of $I_{qr}$. The MOS transistors in level-shifter bias circuit 340a in FIG. 4A may be matched to the corresponding MOS transistors in class AB amplifier 300 in FIG. 3A in order to minimize offset. NMOS transistors 422 and 442 in FIG. 4A and NMOS transistors 322 and 324 in FIG. 3A form a current mirror, and the currents through these NMOS transistors are matched. Since NMOS transistors 422 and 432 in FIG. 4A are matched to NMOS transistors 322 and 332 in FIG. 3A, the quiescent current $I_q$ through NMOS transistor 332 is a scaled version of the quiescent current $I_{qr}$ through NMOS transistor 432. The scaling factor between $I_q$ and $I_{qr}$ may be set based on the ratio of the size of NMOS transistor 332 to the size of NMOS transistor 432.

Level-shifter bias circuit 340a can thus generate the $V_{biasn}$ voltage to (i) provide the proper level shifting for the $V_{drn1}$ and $V_{drn2}$ voltages in class AB amplifier 300 and (ii) set the quiescent current $I_q$ for NMOS transistors 332 and 342 in class AB amplifier 300. The target quiescent current $I_q$ may be obtained by setting the current $I_{br}$ of current source 411 in FIG. 4A and selecting suitable transistor size ratios. In one exemplary design, the quiescent current $I_q$ may be a fixed value and may be selected based on the requirements of the output signal from class AB amplifier 300. In another exemplary design, the quiescent current $I_q$ may be a configurable value and may be adjusted based on the output signal characteristics. For example, a small quiescent current $I_q$ may be used for a small output signal level, and a large quiescent current $I_q$ may be used for a large output signal level.

Figure 4B:
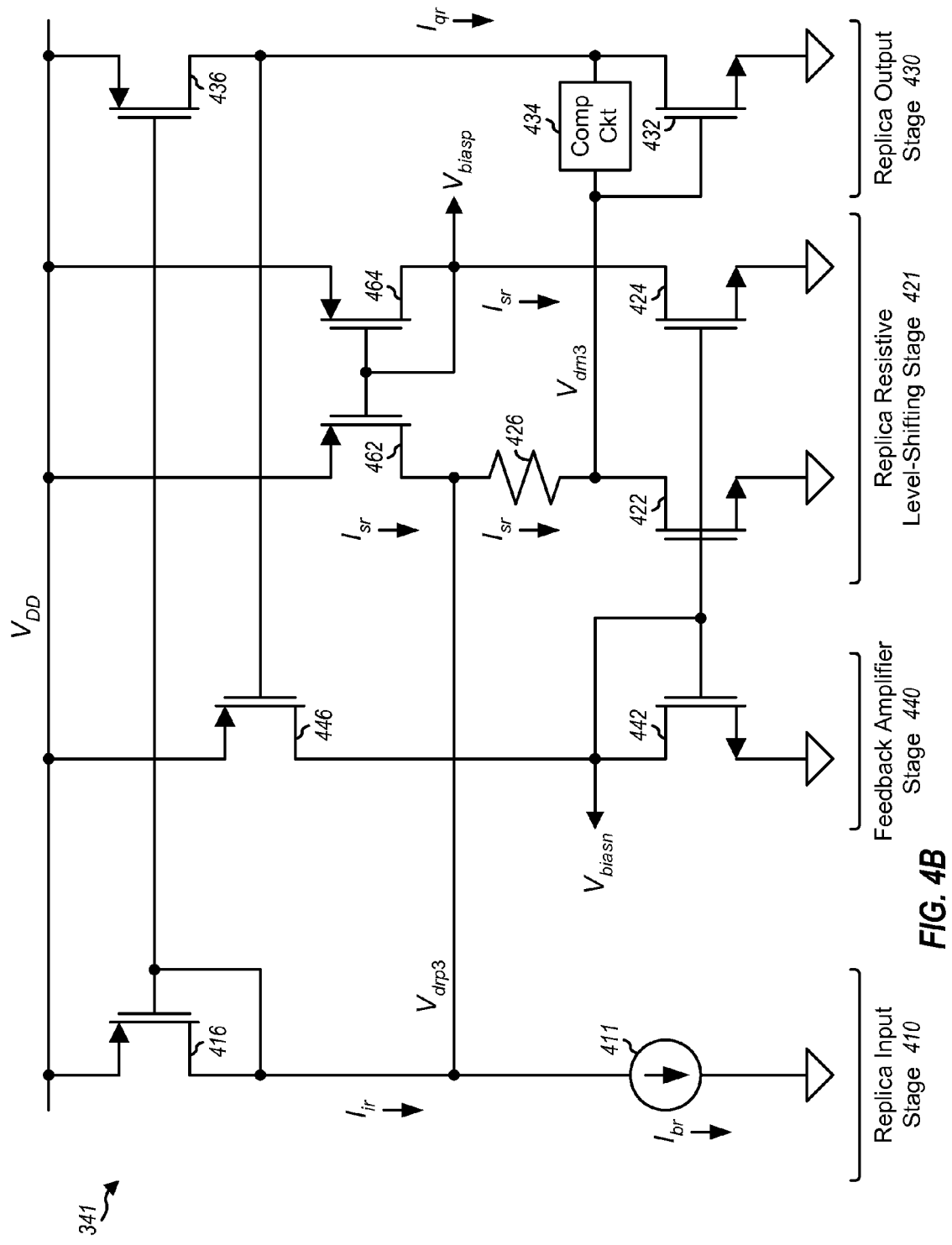

FIG. 4B shows a schematic diagram of an exemplary design of level-shifter bias circuit 341 in FIG. 3B. In this exemplary design, level-shifter bias circuit 341 includes all of the stages show in FIG. 4A except for replica resistive level-shifting stage 420, which is replaced with a replica resistive level-shifting stage 421. Stage 421 includes NMOS transistor 422 and resistor 426, which are coupled as described above for FIG. 4A. Stage 421 further includes an NMOS transistor 424 and PMOS transistors 462 and 464. NMOS transistor 424 has its gate receiving the $V_{biasn}$ voltage, its source coupled to circuit ground, and its drain coupled to the drain of PMOS transistor 464. PMOS transistors 462 and 464 have their sources coupled to the $V_{DD}$ supply voltage and their gates coupled together and providing the $V_{biasp}$ voltage. The drain of PMOS transistor 462 is coupled to one end of resistor 426.

NMOS transistor 424 provides a level-shifting current of $I_{sr}$ matching the current through NMOS transistor 422. PMOS transistors 462 and 464 are coupled as a current mirror, and each PMOS transistor provides the $I_{sr}$ level-shifting current. The current through resistor 426 is thus provided by PMOS transistor 462 instead of PMOS transistor 416, which may improve performance. In this exemplary design, $I_{tr} \approx I_{br} \approx I_{iq}$.

Referring back to FIG. 3B, the $V_{biasp}$ voltage from level-shifter bias circuit 341 in FIG. 4B may be provided to the gates of PMOS transistors 362 and 364 in resistive level-shifting stage 321. PMOS transistor 362 may provide the $I_s$ level-shifting current for resistor 326. Similarly, PMOS transistor 364 may provide the $I_s$ level-shifting current for resistor 328. This may improve the performance of class AB amplifier 302.

Figure 5:
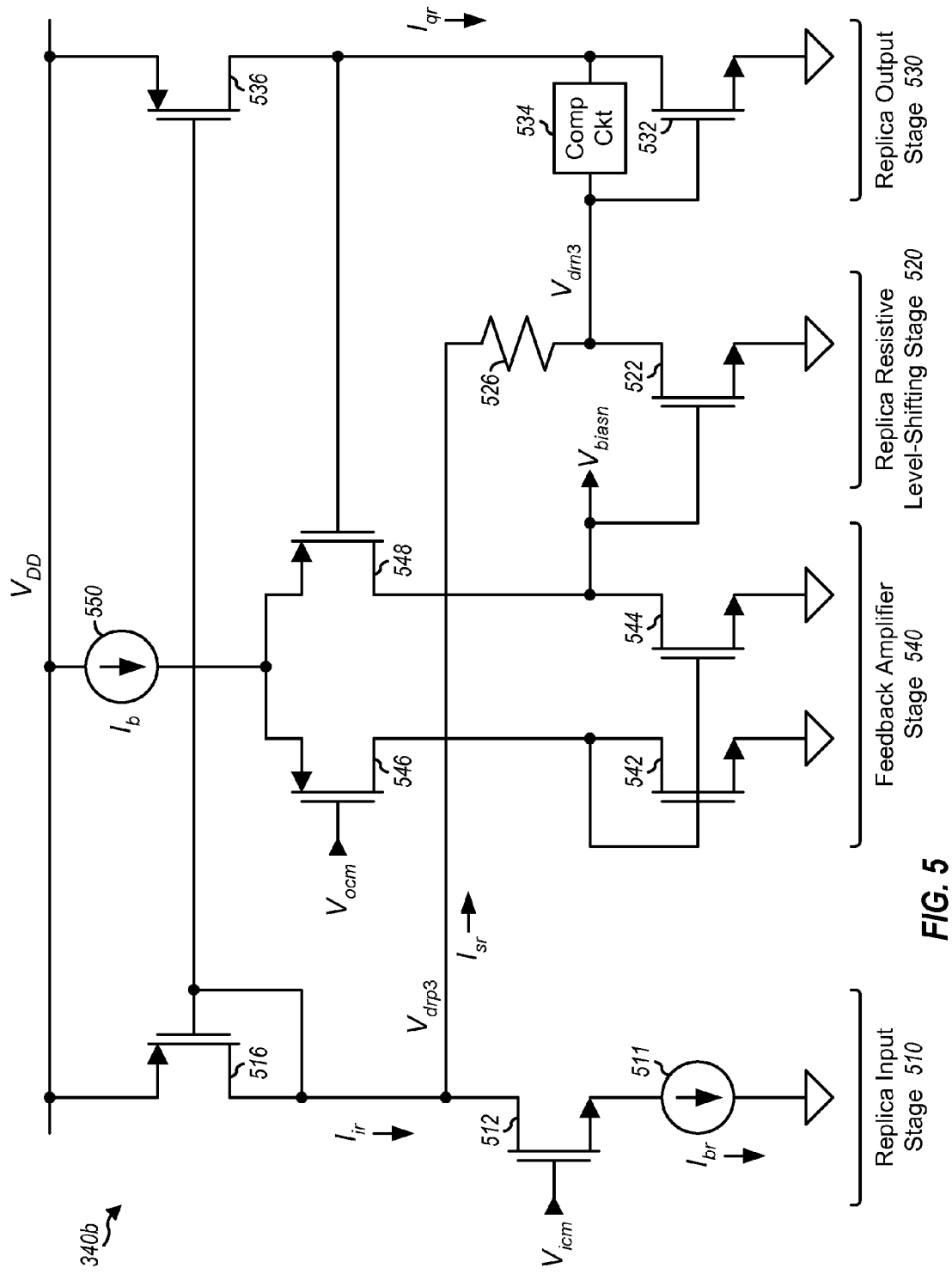
FIG. 5 shows another exemplary design of the level-shifter bias circuit.

FIG. 5 shows a schematic diagram of another exemplary design of a level-shifter bias circuit 340b, which may also be used for level-shifter bias circuit 340 in FIG. 3A. In this exemplary design, level-shifter bias circuit 340b includes a replica input stage 510, a replica resistive level-shifting stage 520, a replica output stage 530, and a feedback amplifier stage 540.

Replica input stage 510 includes a current source 511, an NMOS transistor 512, and a PMOS transistor 516, which are replicas of current source 311, NMOS transistor 312, and PMOS transistor 316, respectively, in input stage 310 in FIG. 3A. NMOS transistor 512 has its source coupled to one end of current source 511, its gate receiving an input common mode voltage, $V_{icm}$, and its drain providing a $V_{drp3}$ drive voltage. The $V_{icm}$ voltage is the average voltage of the $V_{inp}$ and $V_{inn}$ signals provided to class AB amplifier 300 in FIG. 3A. The other end of current source 511 is coupled to circuit ground. PMOS transistor 516 has its source coupled to the $V_{DD}$ supply voltage, its gate coupled to its drain, and its drain coupled to the drain of NMOS transistor 512.

Replica resistive level-shifting stage 520 includes an NMOS transistor 522 and a resistor 526, which are replicas of NMOS transistor 322 and resistor 326, respectively, in FIG. 3A. Replica output stage 530 includes an NMOS transistor 532, a compensation circuit 534, and a PMOS transistor 536, which are replicas of NMOS transistor 332, compensation circuit 334, and PMOS transistor 336, respectively, in FIG. 3A. MOS transistors 522, 532 and 536, resistor 526, and compensation circuit 534 are coupled in the same manner as MOS transistors 422, 432 and 436, resistor 426, and compensation circuit 434 in FIG. 4A.

Feedback amplifier stage 540 includes PMOS transistors 546 and 548 coupled as a differential pair. PMOS transistor 548 has its gate coupled to the drain of PMOS transistor 536, and PMOS transistor 546 has its gate receiving the $V_{ocm}$ voltage. A current source 550 has one end coupled to the sources of PMOS transistors 546 and 548 and the other end coupled to the $V_{DD}$ supply voltage. NMOS transistors 542 and 544 have their sources coupled to circuit ground, their gates coupled together and to the drain of NMOS transistor 542, and their drains coupled to the drains of PMOS transistors 546 and 548, respectively. The drain of NMOS transistor 544 is coupled to the gate of NMOS transistor 522 and also provides the $V_{biasn}$ voltage.

The MOS transistors in level-shifter bias circuit 340b are biased at the same DC voltages as the corresponding MOS transistors in class AB amplifier 300. The gate of NMOS transistor 512 is applied the same input common mode voltage observed by NMOS transistors 312 and 314 in FIG. 3A. PMOS transistors 546 and 548 set the drain voltage of PMOS transistor 536 to the same $V_{ocm}$ voltage observed by PMOS transistors 336 and 346 in FIG. 3A. The $V_{biasn}$ voltage may be generated more accurately with the MOS transistors in level-shifter bias circuit 340b operating at the same DC voltages as the corresponding MOS transistors in class AB amplifier 300.

Level-shifter bias circuit 340b operates as follows. PMOS transistors 516 and 536 are coupled as a current mirror and their drain currents may be as shown in equation (2). A negative feedback loop is used to generate the $V_{biasn}$ voltage for NMOS transistor 522. The negative feedback loop starts at the $V_{biasn}$ voltage, then through NMOS transistor 522, and then through NMOS transistor 532, then through PMOS transistor 548, then ending with NMOS transistor 544. The differential pair composed of PMOS transistors 546 and 548 and the active load composed of NMOS transistors 542 and 544 may provide improved performance over the exemplary design of feedback amplifier stage 440 with NMOS transistor 442 and PMOS transistor 446 in FIG. 4A.

The negative feedback loop generates the $V_{biasn}$ voltage such that NMOS transistor 522 can provide the $V_{drn3}$ voltage such that NMOS transistor 532 will draw the quiescent current of $I_{qr}$. NMOS transistor 522 in FIG. 5 and NMOS transistors 322 and 324 in FIG. 3A form a current mirror, and the currents through these NMOS transistors are matched. Since NMOS transistors 522 and 532 in FIG. 5 are matched to NMOS transistors 322 and 332 in FIG. 3A, the quiescent current $I_q$ through NMOS transistor 332 is a scaled version of the quiescent current $I_{qr}$ through NMOS transistor 532. The scaling factor between $I_q$ and $I_{qr}$ may be set based on transistor size ratio. Level-shifter bias circuit 340b can generate the $V_{biasn}$ voltage to (i) provide the proper level shifting for the $V_{drn1}$ and $V_{drn2}$ voltages in class AB amplifier 300 and (ii) set the quiescent current $I_q$ for NMOS transistors 332 and 342 in class AB amplifier 300.

FIGS. 4A and 4B show two exemplary designs of level-shifter bias circuits 340 and 341 in FIGS. 3A and 3B, respectively. FIG. 5 shows another exemplary design of level-shifter bias circuit 340 in FIG. 3A. Level-shifter bias circuits 340 and 341 may also be implemented with other exemplary designs. In general, level-shifter bias circuits 340 and 341 may include MOS transistors that match the corresponding MOS transistors in class AB amplifiers 300 and 302. An amplifier stage may be used to sense the voltage at the drain of PMOS transistor 436 or 536 and generate the $V_{biasn}$ voltage.

FIG. 6 shows a schematic diagram of an exemplary design of a differential class AB amplifier 600 with resistive level-shifting circuitry. Class AB amplifier 600 is a P-channel design that is complementary to the N-channel design of Class AB amplifier 300 in FIG. 3A. Class AB amplifier 600 includes an input stage 610, a resistive level-shifting stage 620, a class AB output stage 630, a level-shifter bias circuit 640, and an output common mode feedback circuit 650, which may correspond to stages 210 through 250, respectively, in FIG. 2.

The resistors in FIGS. 2 through 6 may have fixed values or variables values. Each resistor may also be implemented in various manners.

Figure 7A:
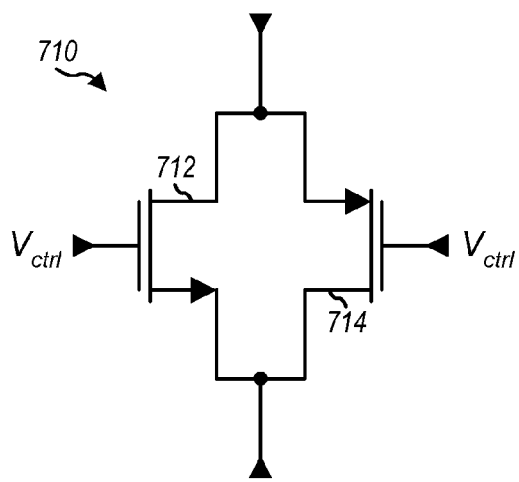
FIGS. 7A through 7C show three exemplary designs of a resistor.

FIG. 7A shows a schematic diagram of an exemplary design of a resistor 710, which may be used for resistor 226 in FIG. 2, resistors 326 and 328 in FIGS. 3A and 3B, resistor 426 in FIGS. 4A and 4B, resistor 526 in FIG. 5, and resistors 626 and 628 in FIG. 6. In this exemplary design, resistor 710 includes an NMOS transistor 712 coupled in parallel with a PMOS transistor 714. The gates of MOS transistors 712 and 714 receive a control voltage, $V_{ctrl}$, which may be varied to change the value of resistor 710.

Figure 7B:
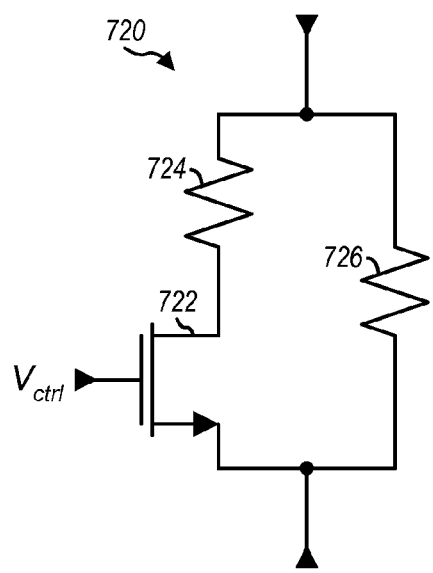

FIG. 7B shows a schematic diagram of an exemplary design of a resistor 720, which may also be used for any of the resistors in FIGS. 2 through 6. In this exemplary design, resistor 720 includes an NMOS transistor 722 coupled in series with a resistor 724, and the combination is coupled in parallel with a resistor 726. The gate of NMOS transistor 722 receives a $V_{ctrl}$ voltage, which may be varied to change the value of resistor 720.

Figure 7C:
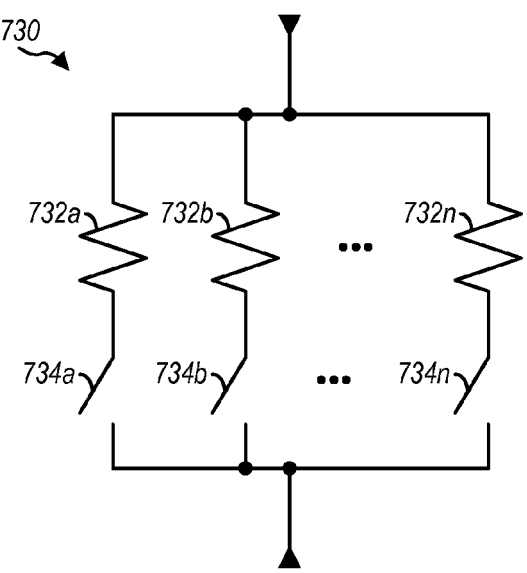

FIG. 7C shows a schematic diagram of an exemplary design of a resistor 730, which may also be used for any of the resistors in FIGS. 2 through 6. In this exemplary design, resistor 730 includes N branches coupled in parallel. Each branch includes a resistor 732 coupled in series with a switch 734. Resistors 732a through 732n for the N branches may have the same value or different values. Each branch may be enabled by closing switch 734 or disabled by opening switch 734. Different resistor values may be obtained by enabling different combination of branches.

Figure 8:
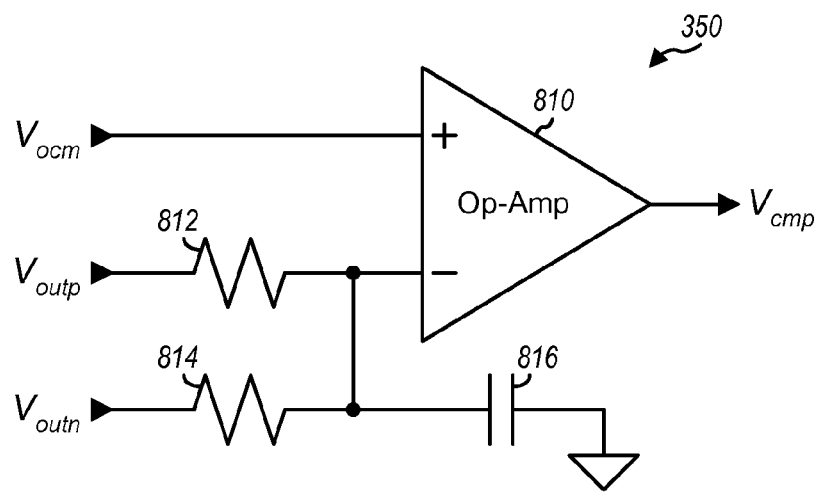
FIG. 8 shows an exemplary design of an output common mode feedback circuit.

FIG. 8 shows a schematic diagram of an exemplary design of output common mode feedback circuit 350 in FIGS. 3A and 3B. Within circuit 350, a resistor 812 has one end coupled to an inverting input of an operational amplifier (op-amp) 810 and the other end receiving the $V_{outp}$ signal. A resistor 814 has one end coupled to the inverting input of op-amp 810 and the other end receiving the $V_{outn}$ signal. The $V_{outp}$ and $V_{outn}$ signals may be from class AB amplifier 300 in FIG. 3A, class AB amplifier 302 in FIG. 3B, etc. A capacitor 816 has one end coupled to the inverting input of op-amp 810 and the other end coupled to circuit ground. Resistors 812 and 814 and capacitor 816 provide filtering to obtain an average value of the $V_{outp}$ and $V_{outn}$ signals. Op-amp 810 has its non-inverting input receiving the $V_{ocm}$ voltage and its output providing the $V_{cmp}$ voltage.

As shown in FIGS. 3A and 3B, output common mode feedback circuit 350 operates within a feedback loop that sets the drain voltage of PMOS transistors 336 and 346 in class AB output stage 330. In particular, the feedback loop adjusts the $V_{cmp}$ voltage such that PMOS transistors 316 and 318 can provide the $V_{drp1}$ and $V_{drp2}$ voltages such that PMOS transistors 336 and 346 will have their drain voltage at $V_{ocm}$.

In general, an apparatus may comprise an input stage, a resistive level-shifting stage, and an output stage, e.g., as shown in FIG. 2. The input stage may receive an input signal and provide a first drive signal, e.g., the $V_{drp}$ signal. The resistive level-shifting stage may receive the first drive signal and provide a second drive signal, e.g., the $V_{drn}$ signal. The output stage may receive the first and second drive signals and provide an output signal. The resistive level-shifting stage may comprise a transistor and a resistor. The transistor may receive a bias voltage and provide the second drive signal. The resistor may be coupled to the transistor and between the first and second drive signals. The resistor may provide a voltage drop between the first and second drive signals, with the voltage drop being determined by the bias voltage applied to the transistor. The output stage may be a class AB output stage comprising a pair of complementary transistors, e.g., an NMOS transistor and a PMOS transistor. The first and second drive signals may be provided to the complementary transistors.

The apparatus may further comprise a first bias circuit (e.g., a level-shifter bias circuit) to generate the bias voltage for the resistive level-shifting stage. The first bias circuit may comprise a replica input stage, a replica resistive level-shifting stage, a replica output stage, and an amplifier stage. The replica input stage may comprise a first transistor (e.g., PMOS transistor 416 in FIG. 4A) matching a second transistor (e.g., PMOS transistor 316 in FIG. 3A) in the input stage. The replica resistive level-shifting stage may comprise a third transistor (e.g., NMOS transistor 422 in FIG. 4A) matching a fourth transistor (e.g., NMOS transistor 322 in FIG. 3A) in the resistive level-shifting stage. The replica output stage may comprise a first pair of complementary transistors (e.g., MOS transistors 432 and 436 in FIG. 4A) matching a second pair of complementary transistors (e.g., MOS transistors 332 and 336 in FIG. 3A) in the output stage. The first pair of complementary transistors may comprise a fifth transistor (e.g., PMOS transistor 436) and a sixth transistor (e.g., NMOS transistor 432). The first transistor in the replica input stage and the fifth transistor in the replica output stage may be coupled as a current mirror. The first pair of complementary transistors may have a first quiescent current (e.g., $I_{qr}$) determined by the current (e.g., $I_{tr}$) through the first transistor in the replica input stage. The second pair of complementary transistors may have a second quiescent current (e.g., $I_q$) determined by the first quiescent current.

The amplifier stage may generate the bias voltage for the resistive level-shifting stage and the replica resistive level-shifting stage. The third transistor (e.g., NMOS transistor 422) in the replica resistive level-shifting stage may be coupled to the sixth transistor (e.g., NMOS transistor 432) in the replica output stage. The amplifier stage may generate the bias voltage for the third transistor to cause the sixth transistor to conduct a target quiescent current.

In one exemplary design shown in FIG. 4A, the amplifier stage may comprise a seventh transistor (e.g., PMOS transistor 446) coupled to the fifth transistor (e.g., PMOS transistors 436) and providing amplification. An eighth transistor (e.g., NMOS transistor 442) may be coupled to the seventh transistor and may provide the bias voltage. In another exemplary design shown in FIG. 4B, the amplifier stage may further comprise a ninth transistor (e.g., PMOS transistor 424) coupled in parallel with the third transistor (e.g., PMOS transistors 422). A current mirror (e.g., composed of PMOS transistors 462 and 464) may be coupled to the ninth transistor and may provide a level-shifting current through the third transistor. In yet another exemplary design shown in FIG. 5, the amplifier stage may comprise a differential pair (e.g., formed by PMOS transistors 546 and 548) having a first input coupled to the fifth transistor and a second input receiving an output common mode voltage. Seventh and eighth transistors (e.g., NMOS transistors 542 and 544) may be coupled to the differential pair, with the eighth transistor providing the bias voltage.

The apparatus may further comprise a second bias circuit (e.g., an output common mode feedback circuit) to receive a differential output signal and generate a second bias voltage (e.g., $V_{cmp}$) for the input stage. The second bias voltage may result in a target common mode output voltage for the differential output signal.

The input stage, the resistive level-shifting stage, the output stage, and the bias circuits may be implemented with MOS transistors, e.g., as shown in FIGS. 2 through 8. These stages and circuits may also be implemented with other types of transistors.

In one exemplary design, an integrated circuit may comprise an input stage, a resistive level-shifting stage, and an output stage. The input stage may receive a differential input signal and provide first and second drive signals, e.g., the $V_{drp1}$ and $V_{drp2}$ signals in FIG. 3A. The resistive level-shifting stage may receive the first and second drive signals and provide third and fourth drive signals, e.g., the $V_{drn1}$ and $V_{drn2}$ signals. The output stage may receive the first through fourth drive signals and provide a differential output signal. The integrated circuit may further comprise a bias circuit to generate a bias voltage for the resistive level-shifting stage. The bias voltage may determine the voltage drop between the first and third drive signals and also between the second and fourth drive signals.

In an exemplary design, input stage may comprise a pair of MOS transistors (e.g., NMOS transistors 312 and 314) coupled as a differential pair and receiving the differential input signal and providing the first and second drive signals. Two additional MOS transistors (e.g., PMOS transistors 316 and 318) may be coupled to the pair of MOS transistors and may provide an active load for the differential pair. In general, the differential pair may be implemented with NMOS transistors, PMOS transistors, and/or other types of transistors.

In an exemplary design, the resistive level-shifting stage may comprise first and second MOS transistors (e.g., NMOS transistors 322 and 324) receiving the bias voltage and providing the third and fourth signal drives, respectively. A first resistor (e.g., resistor 326) may be coupled to the first MOS transistor and between the first and third drive signals. A second resistor (e.g., resistor 328) may be coupled to the second MOS transistor and between the second and fourth drive signals.

In an exemplary design, the output stage may comprise first and second PMOS transistors (e.g., PMOS transistors 336 and 346) coupled to first and second NMOS transistors (e.g., NMOS transistors 332 and 342). The first and second PMOS transistors may receive the first and second drive signals, respectively, and may provide the differential output signal. The first and second NMOS transistors may receive the third and fourth drive signals, respectively. The first PMOS transistor and the first NMOS transistor may form a first class AB output branch. The second PMOS transistor and the second NMOS transistor may form a second class AB output branch.

In an exemplary design, the resistive level-shifting stage may comprise third and fourth NMOS transistors (e.g., NMOS transistors 322 and 324) coupled to the first and second NMOS transistors, respectively, in the output stage. The bias circuit may generate the bias voltage for the third and fourth NMOS transistors to cause the first and second NMOS transistors to conduct a target quiescent current in each of the first and second NMOS transistors. The bias circuit may be implemented with replicas of the input stage, the resistive level-shifting stage, and the output stage, e.g., as shown in FIG. 4A, 4B or 5.

Figure 9:
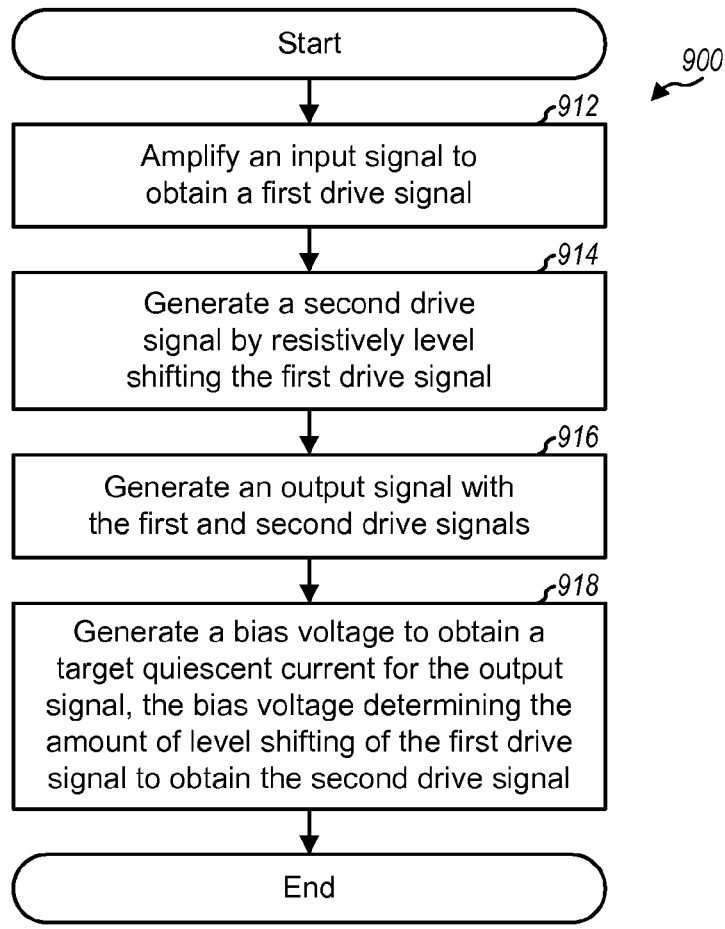
FIG. 9 shows a process for performing amplification.

FIG. 9 shows an exemplary design of a process 900 for performing amplification. An input signal may be amplified to obtain a first drive signal (block 912). A second drive signal may be generated by resistively level shifting the first drive signal (block 914). An output signal may be generated with the first and second drive signals (block 916). A bias voltage may be generated to obtain a target quiescent current for the output signal (block 918). The bias voltage may also determine the amount of level shifting of the first drive signal to obtain the second drive signal.

The bias voltage may be generated with replicas of circuits used for amplifying the input signal in block 912, generating the second drive signal in block 914, and generating the output signal in block 916. In an exemplary design, the bias voltage may be generated by (i) generating a replica quiescent current with a current mirror and (ii) generating the bias voltage with a feedback loop to obtain the replica quiescent current. The target quiescent current for the output signal may be determined by the replica quiescent current.

The class AB amplifier with resistive level-shifting circuitry described herein may provide certain advantages. First, the use of a resistive level-shifting stage may eliminate the need for an active signal conversion stage from PMOS to NMOS and from NMOS to PMOS. Second, the class AB amplifier described herein may have lower power consumption and higher gain-bandwidth product than conventional class AB amplifiers using other conversion circuits between the input stage and the output stage. The lower power consumption may be desirable for portable applications such as wireless devices. The higher gain-bandwidth product may be suitable for high bandwidth applications (e.g., high bandwidth baseband filters) that also require adequate gain.

The class AB amplifier with resistive level-shifting circuitry described herein may be implemented on an IC, an analog IC, an RFIC, a mixed-signal IC, an application specific integrated circuit (ASIC), a printed circuit board (PCB), an electronics device, etc. The class AB amplifier may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the class AB amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an input stage to receive an input signal and provide a first drive signal;
   a resistive level-shifting stage to receive the first drive signal and provide a second drive signal by passively resistively level shifting the first drive signal by an amount determined by a bias voltage;
   an output stage to receive the first and second drive signals and provide an output signal; and
   a feedback stage to receive the output signal and a target voltage and provide a control voltage to the input stage.

2. The apparatus of claim 1, the resistive level-shifting stage comprising
   a transistor to receive the bias voltage and provide the second drive signal, and
   a resistor coupled to the transistor and between the first and second drive signals, the resistor providing a voltage drop between the first and second drive signals.

3. The apparatus of claim 2, the resistive level-shifting stage further comprising a second transistor to receive a second bias voltage and provide a level-shifting current through the resistor.

4. The apparatus of claim 1, the output stage being a class AB output stage comprising a pair of complementary transistors, the first and second drive signals being provided to the complementary transistors.

5. The apparatus of claim 1, further comprising:
   a first bias circuit to generate the bias voltage for the resistive level-shifting stage, the bias voltage determining a voltage drop between the first and second drive signals.

6. The apparatus of claim 5, the first bias circuit comprising
   a replica input stage comprising a first transistor matching a second transistor in the input stage,
   a replica resistive level-shifting stage comprising a third transistor matching a fourth transistor in the resistive level-shifting stage, and
   a replica output stage comprising a first pair of complementary transistors matching a second pair of complementary transistors in the output stage.

7. The apparatus of claim 6, the first pair of complementary transistors in the replica output stage comprising fifth and sixth transistors, the first transistor in the replica input stage and the fifth transistor in the replica output stage being coupled as a current mirror.

8. The apparatus of claim 7, the first pair of complementary transistors in the replica output stage having a first quiescent current determined by a current through the first transistor in the replica input stage, and the second pair of complementary transistors in the output stage having a second quiescent current determined by the first quiescent current.

9. The apparatus of claim 6, the first bias circuit further comprising
   an amplifier stage coupled to the replica resistive level-shifting stage and the replica output stage, the amplifier stage generating the bias voltage for the resistive level-shifting stage and the replica resistive level-shifting stage.

10. The apparatus of claim 9, the first pair of complementary transistors in the replica output stage comprising fifth and sixth transistors, the third transistor in the replica resistive level-shifting stage being coupled to the sixth transistor in the replica output stage, and the amplifier stage generating the bias voltage for the third transistor to cause the sixth transistor to conduct a target quiescent current.

11. The apparatus of claim 6, the replica resistive level-shifting stage further comprising
    a fifth transistor coupled in parallel with the third transistor, and
    a current mirror coupled to the fifth transistor and providing a second bias voltage to generate a level-shifting current for the resistive level-shifting stage.

12. The apparatus of claim 10, the amplifier stage comprising
    a seventh transistor coupled to the fifth transistor and providing amplification, and
    an eighth transistor coupled to the seventh transistor and providing the bias voltage.

13. The apparatus of claim 10, the amplifier stage comprising
a differential pair having a first input coupled to the fifth transistor and a second input receiving an output common mode voltage, and
seventh and eighth transistors coupled to the differential pair, the eighth transistor providing the bias voltage.

14. The apparatus of claim 5, further comprising:
a second bias circuit to receive a differential signal for the output signal and generate a second bias voltage for the input stage, the second bias voltage resulting in a target common mode output voltage for the differential signal.

15. The apparatus of claim 1, the input stage, the resistive level-shifting stage, and the output stage being implemented with metal oxide semiconductor (MOS) transistors.

16. An integrated circuit comprising:
an input stage to receive a differential input signal and provide first and second drive signals;
a resistive level-shifting stage to receive the first and second drive signals and provide third and fourth drive signals by respectively passively resistively level shifting the first and second drive signals by an amount determined by a bias voltage;
an output stage to receive the first through fourth drive signals and provide a differential output signal; and
a feedback stage to receive the differential output signal and a target voltage and provide a control voltage to the input stage.

17. The integrated circuit of claim 16, further comprising:
a bias circuit to generate the bias voltage for the resistive level-shifting stage, the bias voltage determining a voltage drop between the first and third drive signals and between the second and fourth drive signals.

18. The integrated circuit of claim 17, the output stage comprising first and second N-channel MOS (NMOS) transistors providing the differential output signal, the resistive level-shifting stage comprising third and fourth NMOS transistors coupled to the first and second NMOS transistors, respectively, and the bias circuit generating the bias voltage for the third and fourth NMOS transistors to cause the first and second NMOS transistors to each conduct a target quiescent current.

19. The integrated circuit of claim 16, the input stage comprising
first and second metal oxide semiconductor (MOS) transistors coupled as a differential pair and receiving the differential input signal and providing the first and second drive signals, and
third and fourth MOS transistors coupled to the first and second MOS transistors, respectively, and providing an active load for the differential pair.

20. The integrated circuit of claim 16, the resistive level-shifting stage comprising
first and second MOS transistors receiving the bias voltage and providing the third and fourth signal drives, respectively,
a first resistor coupled to the first MOS transistor and between the first and third drive signals, and
a second resistor coupled to the second MOS transistor and between the second and fourth drive signals.

21. The integrated circuit of claim 16, the output stage comprising
first and second P-channel MOS (PMOS) transistors receiving the first and second drive signals, respectively, and providing the differential output signal, and
first and second N-channel MOS (NMOS) transistors coupled to the first and second PMOS transistors, respectively, and receiving the third and fourth drive signals, respectively, the first PMOS transistor and the first NMOS transistor forming a first class AB output branch, and the second PMOS transistor and the second NMOS transistor forming a second class AB output branch.

22. A method comprising:
amplifying an input signal to obtain a first drive signal;
generating a second drive signal by passively resistively level shifting the first drive signal by an amount determined by a bias voltage;
generating an output signal with the first and second drive signals; and
adjusting a control voltage in response to the output signal and a target voltage to obtain a target average for the output signal.

23. The method of claim 22, further comprising:
generating the bias voltage to obtain a target quiescent current for the output signal, the bias voltage determining the amount of level shifting of the first drive signal to obtain the second drive signal.

24. The method of claim 23, the generating the bias voltage comprising
generating the bias voltage with replicas of circuits used for amplifying the input signal, generating the second drive signal, and generating the output signal.

25. The method of claim 23, the generating the bias voltage comprising
generating a replica quiescent current with a current mirror, and
generating the bias voltage with a feedback loop to obtain the replica quiescent current, the target quiescent current for the output signal being determined by the replica quiescent current.

26. An apparatus comprising:
means for amplifying an input signal to obtain a first drive signal;
means for generating a second drive signal by passively resistively level shifting the first drive signal by an amount determined by a bias voltage;
means for generating an output signal with the first and second drive signals;
means for adjusting a control voltage in response to the output signal and a target voltage to obtain a target average for the output signal.

27. The apparatus of claim 26, further comprising:
means for generating the bias voltage to obtain a target quiescent current for the output signal, the bias voltage determining the amount of level shifting of the first drive signal to obtain the second drive signal.

* * * * *